United States Patent [19]

Grabbe et al.

[11] Patent Number: 4,511,197
[45] Date of Patent: Apr. 16, 1985

[54] HIGH DENSITY CONTACT ASSEMBLY

[75] Inventors: Dimitry G. Grabbe, Lisbon Falls, Me.; Iosif Korsunsky, Harrisburg, Pa.

[73] Assignee: AMP Incorporated, Harrisburg, Pa.

[21] Appl. No.: 519,429

[22] Filed: Aug. 1, 1983

[51] Int. Cl.³ ............................................. H01R 9/09
[52] U.S. Cl. ........................... 339/17 CF; 339/75 M; 339/75 MP
[58] Field of Search .......... 339/17 CF, 75 M, 75 MP, 339/176 M, 176 MP, 252 R

[56] References Cited

U.S. PATENT DOCUMENTS

| 4,176,895 | 12/1979 | Aldridge | 339/17 CF |
| 4,188,085 | 2/1980 | Aldridge et al. | 339/176 MP |
| 4,268,102 | 5/1981 | Grabbe | 339/17 CF |
| 4,341,433 | 7/1982 | Cherian et al. | 339/176 MP |

Primary Examiner—John McQuade
Attorney, Agent, or Firm—Donald M. Boles

[57] ABSTRACT

An electrical contact for use with high density, high frequency electrical signals is taught. Briefly stated, an electrical contact which is generally "U"-shaped having at the end of one leg an outer beam portion perpendicularly attached at the end thereof. A second generally "U"-shaped bent portion is perpendicularly disposed at the end of the other leg in overlapping relationship with the outer beam with the free leg of the second "U"-shaped portion resiliently biased against the lower portion of the outer beam.

4 Claims, 4 Drawing Figures

4,511,197

HIGH DENSITY CONTACT ASSEMBLY

BACKGROUND OF THE INVENTION

This invention relates, generally, to a high density contact and more particularly to an electrical contact which may have a surface coated with tin as opposed to gold, having a very short contact length for use with very high frequency electrical signals in high density applications.

With the advent of VLSI circuitry electrical interconnection scheme between adjacent components and their circuit boards requires more and more dense interwire configurations. Additionally, the circuit path length becomes very critical in order to minimize impedance and resistive effects which may alter circuit performance. Two examples of high density contacts which attempt to minimize contact circuit path length may be found in U.S. Pat. No. 4,354,729 "Preloaded Electrical Contact Terminal" issued Oct. 19, 1982, to Grabbe et al. and U.S. Pat. No. 4,268,102 "Low Impedance Electrical Connecting Means from Spaced-Apart Conductors" issued May 19, 1981 to Grabbe. Coupled with these considerations are the need to provide relatively high contact mating forces. Accordingly, gold is generally utilized to plate some if not all of the contact thereby providing less electrical resistance and therefor allowing for lower mating forces.

It is desirable to have a device which is suitable for high density use such as for VLSI chip carriers which does not require the use of precious metals such as gold. Further, it is also desirable to have a device which is relatively simple as well as inexpensive to manufacture. Additionally, it is desirable to have a contact which is replacable, does not use solder as a means of attachment and which provides a wiping motion during contact mating in order to remove absorbed films and oxides which may be present, thereby establishing good metal to metal contact.

Accordingly, the present invention teaches and as an object of the present invention an electrical contact for high density usage comprising a chip carrier having conductive paths thereon, a circuit board having a conductive strip contained thereon, the housing disposed on the circuit board for receiving electrical contacts therein and the carrier thereon, a contact disposed in the housing, the contact having substantially all of its parts lying in a single plane and having a generally "U"-shaped first portion wherein the legs of the "U"-shape comprise an upper and lower cantilever member, the upper and lower cantilevers having outer and inner beams attached perpendicularly respectively thereto, the outer beam having an upper contact surface disposed at the point wherein the outer beam and the upper cantilever meet and having a lower contact surface at the free end of the outer beam, and an inner beam comprised of a second "U"-shaped member having the first leg as a shunt portion which is perpendicularly attached to the end of the lower cantilever and the second leg defining an inner arm having an inner arm beam contact surface attached at the end thereof, the inner arm being resiliently biased against the lower contact surface of the outer beam, the contact being further characterized in that the inner and outer beams are in overlapping relationship such that vertical movement of the chip carrier on the upper contact surface results in a wiping motion between the lower contact surface and the second leg of the inner beam and between the inner beam contact surface and the conductive strip with a resulting development of a contact mating force whereby current flows from the conductive paths through the upper contact surface, the interface point between the lower contact surface and the inner arm of the inner beam and through the inner beam contact surface to the conductive strip.

BRIEF DESCRIPTION OF THE DRAWINGS

Reference is now made to the description of the preferred embodiment illustrated in the accompanying drawings in which.

DESCRIPTION OF THE PREFERRED EMBODIMENT

Figure 1:
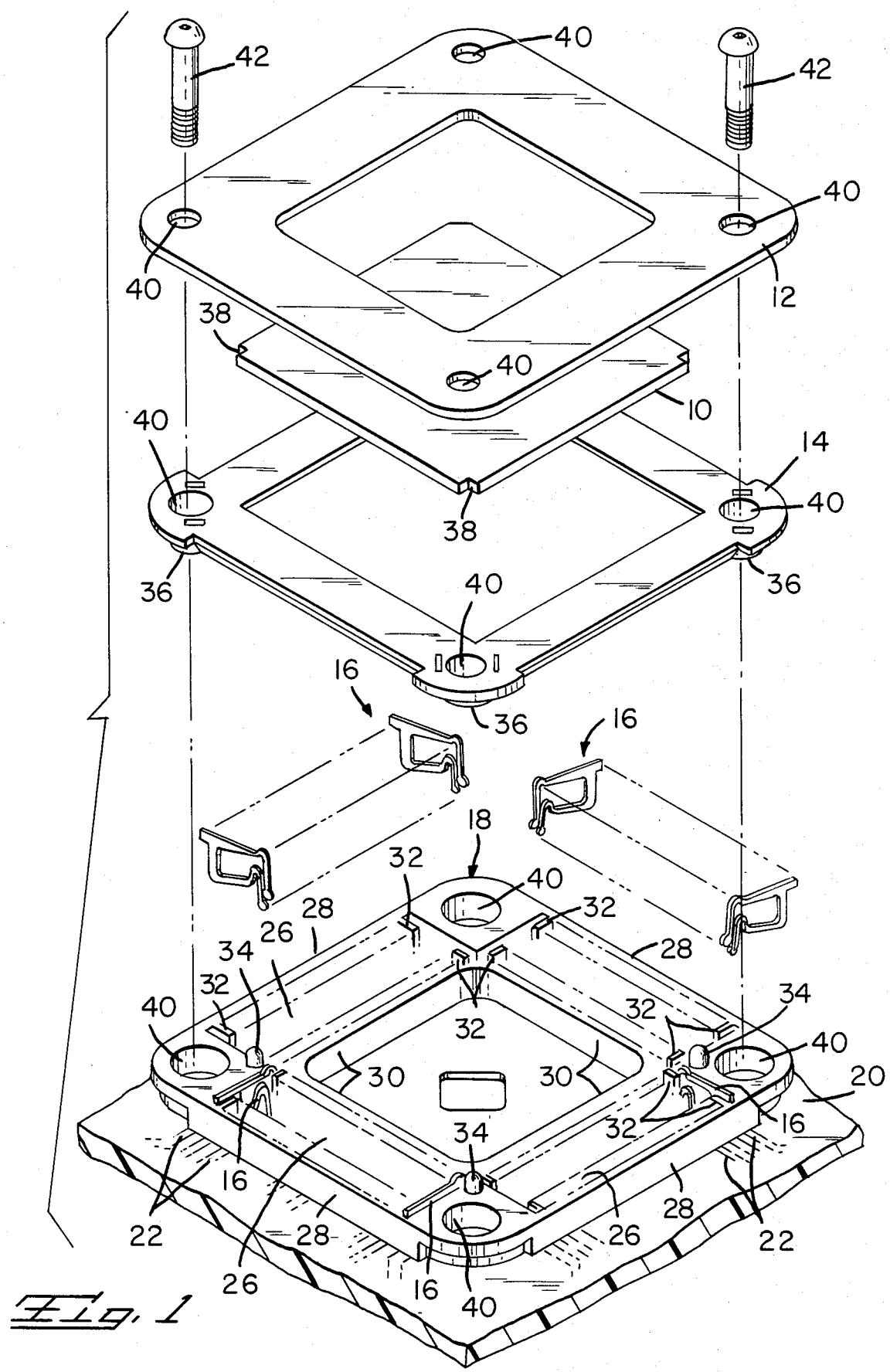
FIG. 1 is an exploded isometric view showing the contact of the present invention in relation to a chip carrier and a chip carrier housing.

Referring now to FIG. 1 there is shown an exploded isometric view of a chip carrier and housing in conjunction with contact of the present invention. More particularly, a chip carrier 10, has a chip and conductive path disposed thereon (not shown) and which is well known in the art. A chip carrier retaining bracket 12 is disposed on top of the chip carrier 10 and is used to hold the chip carrier 10 securely with the remainder of the housing structure described below. A contact retaining nest or bracket 14 is disposed under the chip carrier 10 and is used to retain the contact 16 in the chip carrier socket (housing) 18 (shown more clearly in FIG. 2). The housing 18 is disposed on a printed circuit board 22 with the printed circuit board 20 having conductive strips 22 thereon. The conductive strips 22 would be interconnected with associated circuitry as is well known in the art. A contact region shown generally at 26 is disposed in each of the side of the housing 18 and is used for spacing and holding the contacts 16 therein. The housing 18 has an outer wall 28 and an inner wall 30 having contact spacing barriers 32 disposed on the inner and outer walls 28, 30. Disposed on the contact retaining nest 14 are contact retaining bracket locating tabs 36 which cooperate with the mounting apertures 40 so as to align the contact retaining nest 14 with the chip carrier housing 18. Locating pins 34 are disposed at several corners of the housing 18 and cooperate with the chip carrier locating notches 38 which are disposed on the chip carrier 10 to acurately align the chip carrier 10 with the contacts 16. Retaining bolts 42 are utilized in conjunction with the mounting apertures 40 to maintain the chip carrier 10, chip carrier bracket 12, contact retaining nest 14, and the chip carrier housing 18 securely and accurately aligned onto the printed circuit board 20.

Figure 2:
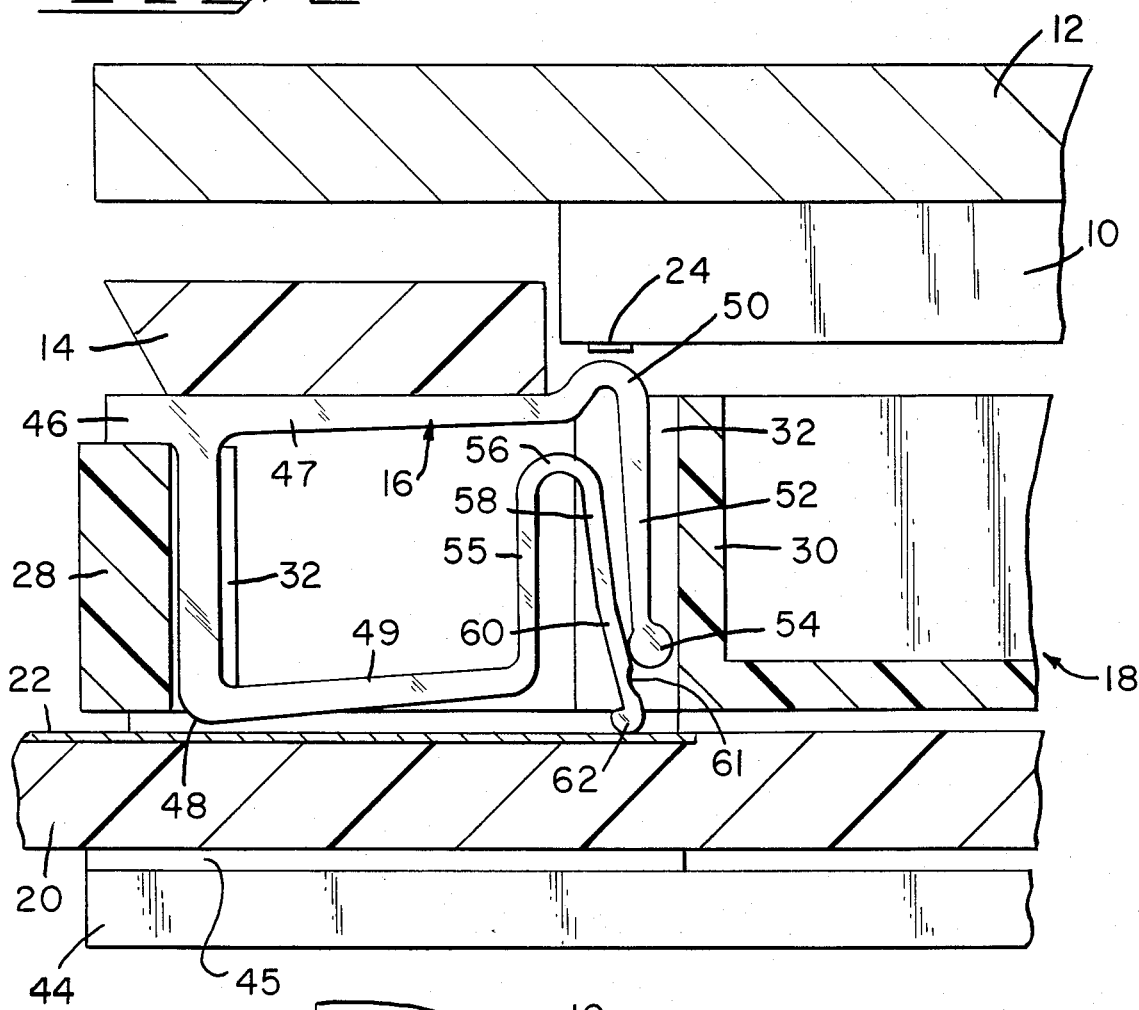
FIG. 2 is a cross sectional view taken through FIG. 1 when assembled.

Referring now to FIG. 2 there is shown a cross sectional view of the assembled structure of FIG. 1. Here it can be seen how the chip carrier 10 having chip carrier contact pads 24 contained thereon is held down by the chip carrier retaining bracket 12. Also shown is the contact retaining nest 14 which holds the contacts 16 in place in the housing 18. The housing 18 is disposed on the printed circuit board 20 which has conductive strips 22 contained thereon. A lower retaining bracket 44 is separated from the printed circuit board 20 by a spacer 45 and cooperates with the retaining bolts which are contained in the mounting apparatus 40 (not shown) thereby providing a sandwiching effect with respect to the printed circuit board 20. Also shown are the outer and inner walls 28, 30 respectively. The contact shown generally at 16 has a contact pivoting arm 46 which rests on top of the outer wall 30, and an upper cantilever 47 and a lower cantilever 49 which are approximately parallel to each other with a pivoting area 48 disposed substantially adjacent to the lower cantilever 49. An outer arm upper contact surface 50 is disposed at the end of the upper cantilever 47 and has adjacent to it an outer arm lower beam 52 having an outer arm lower contact surface 54 at the end thereof. Disposed substantially perpendicular to the lower cantilever 49 is a shunt portion 55 with a rounded inner arm bent portion 56 at the end thereof. The inner arm bent portion 56 has attached thereto an inner arm upper beam and an inner arm lower beam 58, 60 respectively, with the upper and lower beams 58, 60 bent or askew with respect to each other. For simplicity purposes the shunt portion 55 as well as the upper and lower inner beams 58, 60 may be considered as a single beam which is in overlapping relationship with the outer beam 52. Disposed at one end of the inner arm lower beam 60 is an inner beam contact surface 62, with a camming surface (indentation) 61 disposed therebetween.

Figures 3, 4:
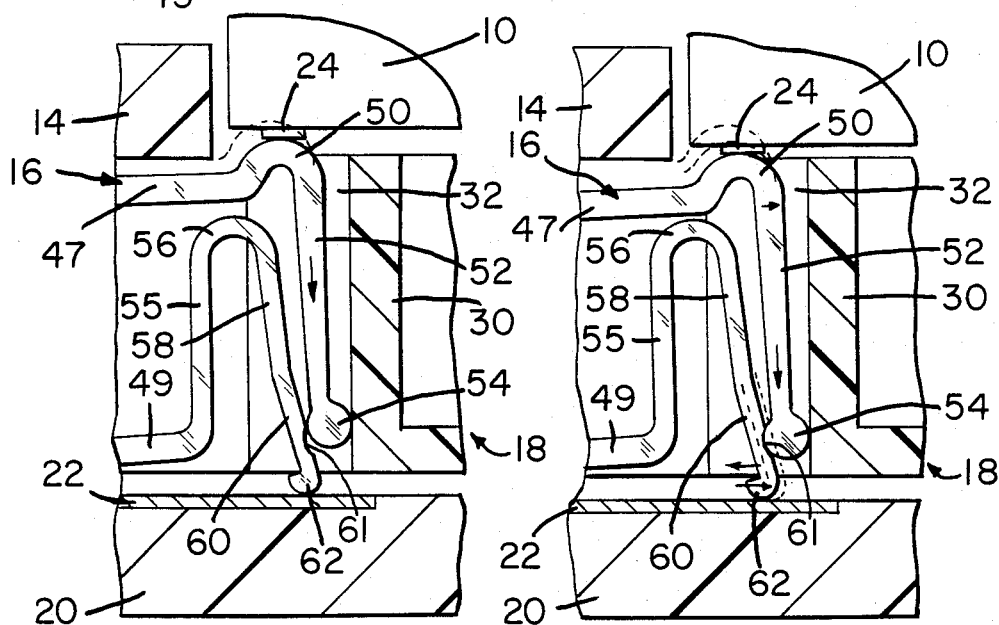
FIGS. 3 and 4 are cross sectional views similar to that in FIG. 2 illustrating the movement of the contact during mating with a chip carrier.

Referring now to FIGS. 3 and 4 there is shown the operation of the contact 16 from partially to fully mated position. Here it can be seen in FIG. 3 that as the chip carrier 10 having chip carrier contact pads 24 disposed thereon engages with the outer arm upper contact surface 5 the entire contact 16 will begin to pivot slightly about the contact pivoting arm 46 thereby resulting in a wiping motion between the outer arm of the contact surface 50 and the chip carrier contact pad 24. Additionally, the outer arm beam 52 is urged downwards thereby forcing the outer arm lower contact surface 54 to come into contact with a portion of the inner arm lower beam 60 and the inner wall 30. As shown in FIG. 4 continued movement of the chip carrier 10 until the chip carrier 10 is fully seated forces the outer arm lower contact surface 54 in a wiping motion to contact the identation 61 in the inner arm lower beam 60 thereby removing metal oxides or other contaminants so as to provide good electrical communication between the outer arm lower contact surface 54 and the inner arm lower beam 50. Coincidentally with the downward movement of the outer arm beam 52 the inner arm lower beam 60 having the inner beam contact surface 62 attached thereto is first forced to the left until the contact surface 54 seats fully in the indentation 61. This then allows the lower beam 60 to back up slightly to the right such that a wiping motion is produced between the inner arm beam contact surface 63 and the conductive strips 22 thereby wiping away any oxides or contaminants so as to provide good electrical communication between the conductive strips 22 and the inner beam contact surface 62. This thereby provides a path for electrical communication between the conductive strip 22, the inner beam contact surface 62 through the inner arm lower beam 60 to the outer arm lower contact surface 54 and thence to the chip carrier contact pad 24 via the outer arm beam 52 and the outer arm upper contact surface 50.

Accordingly, in referring to FIGS. 2, 3 and 4 the entire function of the contact 16 may be realized.

Through the use of the contact pivoting arm 46 the entire contact 16 pivots to an extent about the pivoting area at 48. The upper and lower cantilevers 47, 49 provide outwardly directed forces which help to insure very high contact mating forces between the regions of electrical communication as discussed earlier. The shunt portion 55 in conjunction with the inner arm bent portion radially urges, in an counterclockwise fashion, the inner arm lower beam 60 towards the outer arm lower contact surface 54, thereby insuring good electrical contact therebetween with the outer arm upper contact surface 50 in conjunction with the outer cantilever 47 providing suitable contact mating forces to the chip carrier contact pad 24. In this manner a contact 16 which in the preferred embodiment of the present invention is stamped from a single piece of sheet metal stock of uniform thickness may be comprised solely of tin or lead tin alloys. Therefore, while gold which is used for contact surfaces may require 80 grams of force for sufficient contact forces, the present contact 16 provides contact forces which are nominally two to five times as great thereby allowing for the use of tin or lead tin alloys, which typically require higher contact forces in order to insure the same level of electrical characteristics as those exhibited by gold. Further, since the anchoring area or point of the contact 16 with respect to the chip carrier housing 18 is at the end of the contact 16 which is substantially opposite that of the point of electrical contact between the chip carrier pad 24 and the outer arm upper contact surface 50 a relatively large compliant member is provided. Therefore, any displacement which may occur during temperature changes which will affect displacement of the housing 18, as well as the chip carrier 10 will result in no motion between the chip carrier 10 and the electrical contact area between 24 and 50 as well as the outer arm lower contact surface 54 and the inner arm lower beam 60. This will result in preventing what is commonly referred to as fretting corrosion which is the formation of oxide at the contact interface point due to the periodic motion or rocking between contact interface points.

It is to be understood that many variations of the present invention may be utilized without departing from the spirit and scope of the present invention. For example, circuit boards which have been silk screened may be utilized. Further, different types of housing or housing configurations as well as different type of retainer or bracket devices may be utilized. Also, different types of metals or plated metals may be utilized in conjunction with the contact or the contact itself may be bent into shape as opposed to stamping. Additionally, different types of arrangements for holding the contacts in the housing other than the pivoting arm may be utilized. The contact may be of a nonuniform thickness such that portions of the inner or outer beams as well as the cantilevers may offer differing contact mating forces. Futher, the cantilevers need not be essentially parallel, while the outer arm lower contact surface when cooperating with the inner arm lower beam need not impinge upon the inner wall to cause proper movement of the inner arm lower beam. Also, the inner arm upper and lower beams may form a relatively straight member.

Therefore, in addition to the above-enumerated advantages, the disclosed invention produces an electrical contact which is relatively inexpensive to manufacture, simple and relatively inexpensive to utilize, readily replaceable without the use of solder and which allows for nonprecious metals to be utilized while still providing adequate contact mating forces.

What is claimed is:

1. An electrical connector for high density usage, comprising:
    a chip carrier having a conductive path thereon;
    a circuit board having a conductive strip contained thereon;
    a housing disposed on said circuit board for receiving said chip carrier thereon;
    contact means disposed in said housing said contact means having substantially all of its parts lying in a single plane and having a generally "U"-shaped first portion wherein the legs of said "U"-shape comprise an upper and a lower cantilever member, said upper cantilever member and said lower cantilever member having outer and inner beams attached perpendicularly respectively thereto, said outer beam having an upper contact surface disposed at the point wherein said outer beam and said upper cantilever member meet and having a lower contact surface at the free end of said outer beam, said inner beam comprised of a second generally "U"-shaped member having the first leg as a shunt portion which is perpendicularly attached to the end of the lower cantilever member and the second leg defining an inner arm having an inner arm beam contact surface attached at the end thereof, said inner arm being resiliently biased against the lower contact surface of said outer beam, said contact means being further characterized in that:
    said inner and outer beams are in overlapping relationship such that vertical movement of the chip carrier on said upper contact surface results in a wiping motion between said lower contact surface and said second leg of said inner beam and between the inner beam contact surface and said conductive strip with the resulting development of a contact mating force whereby current flows from said conductive path through said upper contact surface, the interface point between said lower contact surface and said inner arm of said inner beam and through said inner beam contact surface to said conductive strip.

2. A device according to claim 1 wherein said inner arm is comprised of an inner arm upper beam and an inner arm lower beam said inner arm lower beam being askew with respect to said inner arm upper beam.

3. A device according to claim 2 wherein said inner arm lower beam has an indentation therein such that upon the vertical movement of said lower contact surface against said inner arm lower beam causes said lower beam is urged horizontally until such time as said lower contact surface cooperatively engages said indentation thereby allowing said inner arm lower beam to move slightly in the opposite horizontal direction, thereby causing a back and forth wiping motion between said inner arm beam contact surface and said conductive strip.

4. A device according to claim 1 wherein a contact pivoting arm is disposed parallel to said upper cantilever member and extends beyond the base of said first "U"-shaped portion, said pivoting arm disposed in said housing such that upon the vertical urging of said chip carrier on said upper contact surface, said contact means is allowed to pivot slightly thereby causing a wiping motion between said upper contact surface and said conductive path as well as between said inner beams contact surface and said conductive strip.

* * * * *